United States Patent [19]

Morris

[11] 4,401,943

[45] Aug. 30, 1983

[54] ELECTRICAL EFFICIENCY METER

[75] Inventor: Donald G. Morris, Tucson, Ariz.

[73] Assignee: Betty Ann Garrett, Camdenton, Mo.

[21] Appl. No.: 961,658

[22] Filed: Nov. 17, 1978

Related U.S. Application Data

[63] Continuation of Ser. No. 588,288, Jun. 19, 1975, abandoned.

[51] Int. Cl.³ .................. G01R 1/08; G01R 15/08
[52] U.S. Cl. ........................... 324/157; 235/85 R; 324/115
[58] Field of Search ............... 324/115, 113, 127, 116, 324/134, 137, 149, 157; 235/61 M, 64.7, 70 R, 70 A, 85 R, 86, 87, 88 R, 89 R; 364/483, 464

[56] References Cited

U.S. PATENT DOCUMENTS

| | | | |
|---|---|---|---|
| 964,695 | 7/1910 | Rickman | 235/61 M |
| 2,268,105 | 12/1941 | Bing | 235/64.7 |
| 2,461,930 | 2/1949 | Simpson | 235/64.7 |

Primary Examiner—Ernest F. Karlsen
Attorney, Agent, or Firm—Gregory J. Nelson

[57] ABSTRACT

A device for determining the operational costs of electrical devices. A case encloses a measuring instrument including a circuit which is connectable to a power source and to the device being checked. The instrument has a dial calibrated to give readings directly related to current consumption. The user applies the applicable energy rate at computation means on the case to determine the operational cost in a period of time.

2 Claims, 6 Drawing Figures

ELECTRICAL EFFICIENCY METER

This is a continuation of application Ser. No. 588,288, filed June 19, 1975, now abandoned.

The present invention relates to a device for measuring electrical energy and more particularly relates to a meter for measuring the electrical energy consumed by various electrical appliances and devices giving an indication of the operational cost of such appliance or device in a selected unit of time as, for example, the operational cost per kilowatt-hour.

Present day energy costs and shortages have created an acute awareness on the part of electrical consumers of the operational costs of various appliances and devices which are customarily used in the home and industry. A knowledge of the operational cost of appliances and devices is also a useful way of conserving energy. If the consumer is aware of operational cost of, for example, an electric heater the consumer will be more likely to shut the device off when it is not in use resulting in a reduction in energy costs. Similarly, consideration of the energy cost involved in operating different applicances may be an important factor in selecting which appliance to use. For example, commonly found kitchen cooking appliances such as ovens, electric skillets, micro-wave ovens and toaster ovens all consume electrical energy at various rates. The consumer may wish to select the appliance which can perform the necessary operation at the lowest energy consumption.

A knowledge of the operational cost of electrical devices can result in even more significant savings in industrial and commercial applications where the selection of particularly efficient electrical apparatus or machine may result in significant savings over a prolonged period of time.

In view of the foregoing, it will be obvious that a simple device giving the electrical consumer indications of the operational costs of electrical devices would fulfill a substantial need. Most devices currently available for this purpose are more sophisticated power level indicators for use in special industrial applications. These meters, due to their specialized nature, are unsuitable for use by the average consumer. Other types of electrical meters, are basically variations of the conventional watt-hour meter generally found at most residences and business locations. This type of meter is not suitable for this purpose in that a direct reading of operational cost is not indicated, but rather meters of this type give a reading of watts or kilowatt-hours. It is then necessary for the consumer to mathematically compute the operational cost by applying the appropriate electric rate to the quantity of energy consumed as measured over a selected period of time.

Other meters such as the type shown in U.S. Pat. No. 796,034 give a reading of totalized operational cost but do not give the consumer an indication of the operational cost in terms of cost in a given time period. This latter reading is most meaningful to the consumer in determining operational cost and efficiency of electrical appliances.

Briefly, in accordance with the present invention, an electrical meter is provided which has electrical measuring mechanism such as a moving-iron type A.C. voltmeter mechanism housed in an instrument cap. The voltmeter mechanism is connected across a transformer to a circuit which is adapted to connect to the electrical device being checked. Appropriate male and female connectors are provided in the meter case. A scale on the voltmeter is calibrated to provide a reading directly indicative of operational costs per unit of time such as cents per kilowatt-hour. In other embodiments the dial may include multiple calibrated scales representing various electric rates so that operational costs at different rates can be directly determined. Another embodiment of the present invention uses a slide rule type of calculator so the consumer can determine operational costs in a unit of time in accordance with the applicable energy rates schedule.

A more complete understanding of the present invention will be had from the following description, claims and drawings in which:

Figure 1:
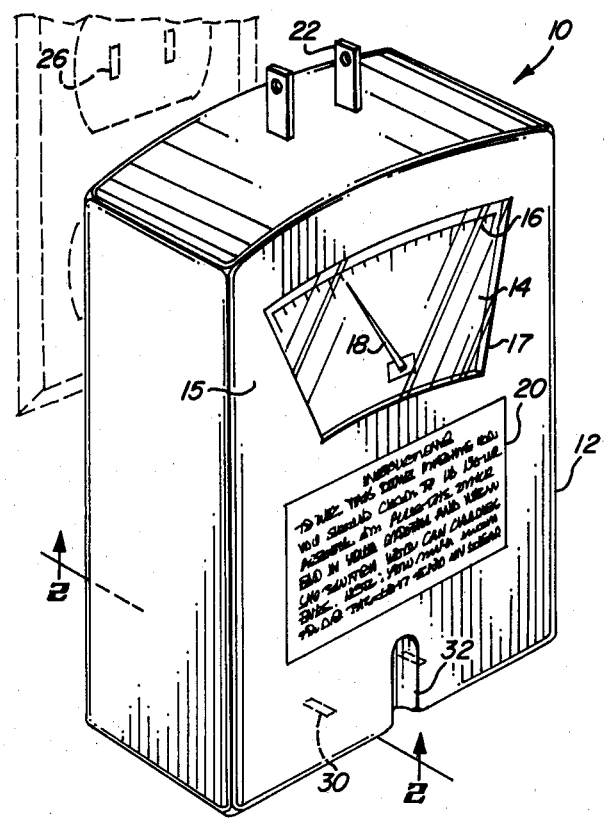
FIG. 1 is a perspective view showing the electrical meter of the present invention.
Figure 2:
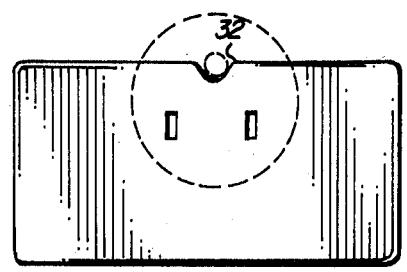
FIG. 2 is a bottom view of the meter of the present invention illustrating a three-prong plug connected to the meter.
Figure 3:
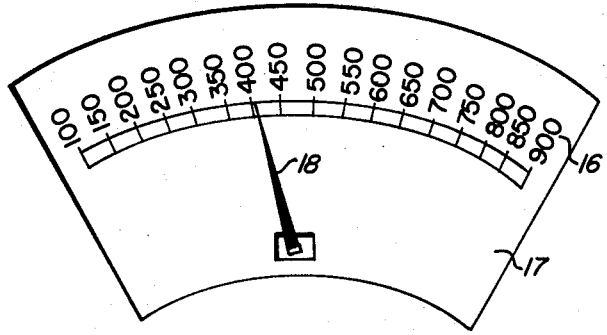
FIG. 3 is an enlarged view illustrating the meter dial and scale carried thereon.

Turning now to the drawings, particularly FIGS. 1 to 3, the electrical meter of the present invention is generally designated by the numeral 10. Meter 10 includes a generally rectangular case 12 which is constructed of a suitable electrical insulation material. The dial 14 of power measuring instrument 17 projects through an aperture in the front of case 12. Dial 14 has a suitably calibrated scale 16 which is swept by pointer 18. Pointer 18 is driven by a measuring mechanism 17 as will be explained hereafter. A panel 20 also carried prominently on the meter below dial 14 carries instructions for use of the meter and for determining the operational cost in accordance with the applicable electric rate schedules.

Male plug 22 extends from the top of the meter case 12 which can be connected to any conventional 110 VAC outlet such as that indicated by the numeral 26. A line cord, not shown, may be attached to the meter terminating at a male plug. The lower end of the housing 12 provided with female receptacle 30 which receives the male plug of the appliance or device being tested. An axial groove or slot 32 is provided in the face 15 of the housing 12 so that three-pronged grounded connectors can be accommodated. The large ground prong, as seen in FIG. 2, is accepted in slot 32. By providing slot 32 in the housing, the total width of the housing 12 can be kept at a minimum. Of course, if applicable codes require, receptacle 32 can be provided with a grounded connection.

Figure 6:
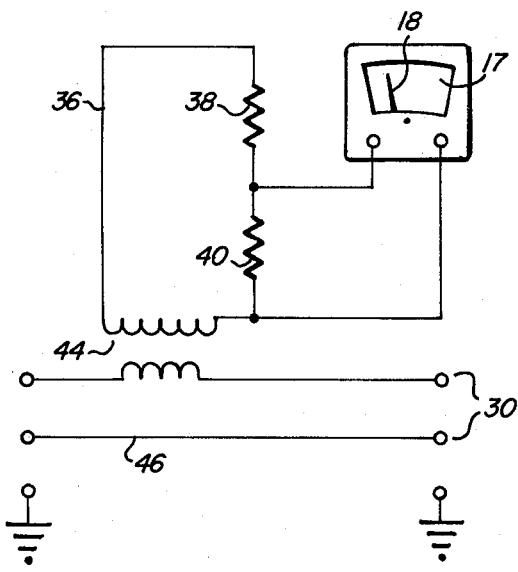
FIG. 6 is a schematic view of the electrical circuit of the meter of the present invention.

FIG. 6 illustrates schematically the measuring instrument and circuit. Measuring instrument 17 can be selected from various types of A. C. instruments such as an ammeter, voltmeter or wattmeter. A moving-iron type instrument in which a moving member soft iron interacts with the magnetic field of the coil to produce deflection or mechanisms of the electrodynamometer type can be used. Voltmeters may be used to measure power in A.C. circuits, however, accuracy in some instances may be effected by phase displacement of current and voltage.

Mechanism 17 is connected in attenuation network 36 having fixed resistances 38 and 40. Transformer 44 is interposed between the attenuation network 36 and the power circuit 46 into which the appliance being checked is connected. Circuit 46 is connectable to the device being checked and to a source of electrical energy at connectors 26 and 30, respectively. Attenuation circuit 36 serves to match the maximum output of the transformer with the range of instrument 14.

The details of instrument dial 14 are more clearly shown in FIG. 3. Scale 16 on dial 14 is calibrated to give a reading directly correlated to energy costs in a given period of time. For example, scale 14 has progressive numerical graduation ranging from 100 to 900. These numbers are directly read under pointer 18 and are directly representative of applicable energy cost. The scale calibration will depend upon the type and range of instrument 17 and the selection of the transformer and circuit components as well as the desired scale factors. Conventionally, the meter will be calibrated to give readings in terms of operational costs in cents per kilowatt-hour. Other power and time units may be used.

Since energy costs vary with the geographical location and classification of the user, it will be necessary to take the numeral indicated on dial 14 and directly determine the energy cost. For this purpose an instruction panel 20 gives the consumer the information that he needs to make this determination. The legend on panel 20 reads as follows:

"It is easy to figure the cost of operation of any device. Simply multiply the cost of power per kilowatt hour by the reading on the dial of the meter and point or five decimal places (adding zeros before the first digit if necessary). The answer is the cost of operation of the device in cents per hour."

The consumer can easily determine the applicable service fee by contacting his utility and simply multipying the applicable power rate by the dial reading. The meter of the present invention will be more clearly understood from the following example.

A meter was constructed in accordance with the present invention. Transformer 44 was of a toroidal design for 60 Hz operation. Instrument 17 was a conventional moving-iron A.C. voltmeter having a maximum range of 10 volts. The scale of the voltmeter mechanism was calibrated as shown in FIG. 2 having graduations of equal increments extending between 100 and 900. In the attenuation networks, resistance 40 was selected at approximately 8.30 ohms and resistor 38 was selected approximately 1.8 ohms. It was determined by checking with the utility that the cost of electrical energy applicable to the consumer was approximately 0.0200 cents per kilowatt-hour. To check the cost of operation of a small appliance, for example a toaster oven, the male plug 22 of the meter was connected to an ordinary household outlet. The plug on the electrical appliance was connected at female receptacle 30 of the meter. Pointer 18 of instrument 17 was magnetically deflected and gave a reading of 750. The consumer noted this reading and following the instructions at panel 20 multiplied this reading by the applicable rate of 0.02 cents per kilowatt-hour and determined that it cost 15 cents to operate the device for an hour. It will be noted that the meter 17 is extremely easy and convenient to use. The readings are taken directly and no difficult computations are necessary. Further, due to the size, the device is portable and can easily be carried about by the user.

Figure 4:
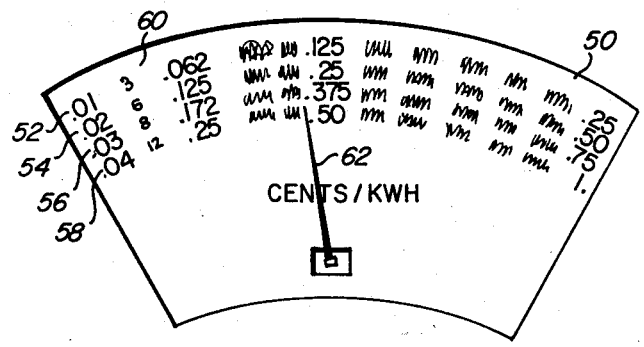
FIG. 4 is a view illustrating an alternate form of the indicator dial and scale.

As pointed out above, electric rates vary in different geographical areas and by type of consumer. Accordingly, FIG. 4 illustrates an alternate embodiment of the meter dial which is generally designated by the numeral 50. Meter dial 50 is calibrated having multiple scales 52, 54, 56 and 58, which are calibrated at various energy costs. The lefthand side of the scale is a column 60 showing the applicable electrical rate. For example, if the rate applicable to the consumer is 4 cents per kilowatt-hour, this figure is located in left hand column 60 and corresponds to scale 58 and the operational costs can be read directly beneath pointer 62. In this way, the consumer can directly read the operational costs of the device without the necessity of having to apply a multiplier to the figure read on the scale.

Figure 5:
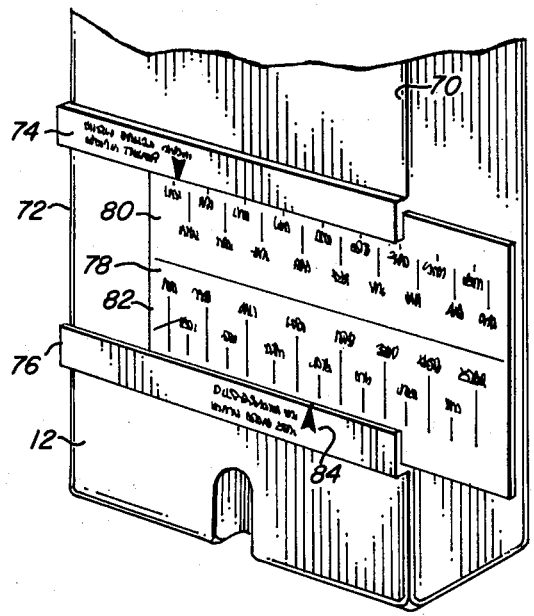
FIG. 5 is a perspective view illustrating a portion of the meter case showing decimal means for determining energy costs at various energy rate schedules.

FIG. 5 shows still another embodiment of the present invention which is generally designated by the numeral 70. In this embodiment the meter dial 14 is calibrated as shown in FIG. 3 giving a numerical reading indicative of energy consumption This figure must then be multiplied by the applicable energy rate to determine the cost of operation per hour. To accomplish the latter computation, a slide rule device 72 is provided on the face of the meter face 12. Slide rule 72 includes upper and lower flanges 74 and 76 which slidably receive scale 78. Flange 74 carries indicia representing various energy costs. The upper half of slide 78 is calibrated having scale 80 which carries indicia corresponding to the readings dial scale 16. The lower portion of slide 78 carries a scale 82 representing various operational costs. A marker 84 on lower flange 76 indicates the operational cost. To use the device embodiment 70 the meter reading from scale 16 is located on scale 80. The appropriate number on scale 80 is aligned with the applicable energy cost as located on flange 74. The operational cost can then be directly read at indicator arrow 84 on scale 82. This eliminates the necessity of having to do the mental and manual computation to determine operational costs.

Thus the foregoing provides a simple, reliable device for readily determining electrical operational costs for a predetermined period of time. The device can be ecomonically manufactured and is accurate and convenient for the consumer to use.

It will be obvious to those skilled in the art to make various changes, alterations and modifications to the device of the present invention. To the extent that these changes, alterations and modifications do not depart from the spirit and scope of the appended claims, they are intended to be encompassed therein.

I claim:

1. An apparatus for determining the cost of operation of an electrical device in a pre-determined unit of time when connected to a power source having pre-determined voltage and at relatively constant current during said period of time, said apparatus comprising:
   (a) an instrument case having a front and including male plug associated therewith for connection to a power source and a female socket associated therewith for connection to the device to be tested;
   (b) an ammeter circuit within said case for measuring current, said ammeter circuit being operatively connected to said plug and said socket whereby said ammeter circuit is interposed between a power source having pre-determined voltage and the electrical device being checked;

(c) a dial on said instrument case operably connected to said ammeter circuit having a dial scale calibrated to give a numerical reading correlated to measured current; and (d) slide rule computation means on said instrument case adjacent said dial including:
 (i) a first scale having indicia thereon corresponding to the calibration of said dial;
 (ii) a second scale having indicia representative of various costs of power, said second and first scales being moveable relative to one another;
 (iii) a third scale having indicia thereon representing various operational costs of power in a pre-determined unit of time, said indicia on said third scale being the mathematical product of combinations of various indicia on said first and second scales; and
 (iv) indicator means cooperative with said third scale whereby the user can compute the operational cost of the electrical device in a selected unit of time at pre-determined voltage and substantially constant current during said period by aligning the reading obtained on the dial of said instrument means on said first scale with applicable energy cost on said second scale and thereafter determining the operational cost by reading the cost on said third scale at said indicator means.

2. An apparatus for determining the cost of operation of an electrical device in a pre-determined unit of time when connected to a power source having pre-determined voltage and at relatively constant current during said period of time, said apparatus comprising:

(a) an instrument case having a front and including male plug associated therewith for connection to a power source and a female socket associated therewith for connection to the device to be tested;

(b) an ammeter circuit within said case for measuring current, said ammeter circuit being operatively connected to said plug and said socket whereby said ammeter circuit is interposed between a power source having pre-determined voltage and the electrical device being checked;

(c) a dial on said instrument case operably connected to said ammeter circuit having a dial scale calibrated to give a numerical reading correlated to measured current; and (d) computation means on said instrument case adjacent said dial, said computation means including first and second generally spaced apart flange means, said first flange means carrying indicia thereon representative of various power costs, slide means slideable relative to said first and second flange means, said slide means having a second scale thereon having indicia thereon corresponding to the calibration of said dial, said second scale means being directly adjacent said first flange means, said slide further having third scale means thereon disposed adjacent said second flange, said third scale having indicia thereon representative of various operational costs in a selected period of time, said indicia on said third scale being the mathematical product of combinations of various indicia on said first and second scales, marker means on said second flange means cooperable with said third scale whereby the user can compute the operational cost of electrical device in a selected unit of time by aligning the reading obtained on the dial of said instrument means on said first scale with the applicable energy cost on the second scale and determining the operational cost on said third scale adjacent said marker.

* * * * *